(12) United States Patent
Oohata

(10) Patent No.: US 6,961,993 B2
(45) Date of Patent: Nov. 8, 2005

(54) METHOD OF TRANSFERRING AND MOUNTING ELEMENTS

(75) Inventor: Toyoharu Oohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/972,626

(22) Filed: Oct. 5, 2001

(65) Prior Publication Data
US 2002/0064032 A1  May 30, 2002

(30) Foreign Application Priority Data
Oct. 6, 2000  (JP) .......................... P2000-307615

(51) Int. Cl.[7] .............................................. H05K 3/30
(52) U.S. Cl. ........................... 29/832; 29/825; 29/830; 29/833; 29/834; 29/564.1; 257/66; 438/30; 438/158
(58) Field of Search ..................... 29/418, 830, 759, 29/760, 832–834, 836, 840, 564.1; 269/903, 269/289 R; 451/364; 361/760; 257/60, 66, 257/E21.703; 438/27, 30, 158, 977

(56) References Cited

U.S. PATENT DOCUMENTS

| | | | |
|---|---|---|---|
| 3,707,760 A | * | 1/1973 | Citrin .......................... 29/413 |
| 4,465,543 A | * | 8/1984 | Sadamasa et al. ............. 29/430 |
| 5,206,749 A | | 4/1993 | Zavracky et al. |
| 5,258,320 A | | 11/1993 | Zavracky et al. |
| 5,438,241 A | | 8/1995 | Zavracky et al. |
| 5,783,856 A | | 7/1998 | Smith et al. |
| 5,824,186 A | | 10/1998 | Smith et al. |
| 6,027,958 A | * | 2/2000 | Vu et al. ..................... 438/110 |
| 6,555,408 B1 | * | 4/2003 | Jacobsen et al. .............. 438/28 |

FOREIGN PATENT DOCUMENTS

| | | |
|---|---|---|
| EP | 0 151 508 | 8/1985 |
| JP | 56-17385 | * 2/1981 |
| JP | 60-181778 | 9/1985 |
| JP | 07-263754 | 10/1995 |
| JP | 10-305620 | 11/1998 |
| JP | 11-142878 | 5/1999 |

* cited by examiner

*Primary Examiner*—Minh Trinh
*Assistant Examiner*—Donghai D. Nguyen
(74) *Attorney, Agent, or Firm*—Sonnenschein, Nath & Rosenthal LLP

(57) ABSTRACT

A device mounting method capable of efficiently, accurately arraying micro-devices on a circuit board is provided. The method includes a device separating step of separating a plurality of LED chips, which have been arrayed with a specific period on a wafer, into individual LED chips while keeping the arrayed state of the LED chips as it is, a device re-arraying step of handling the individually separated LED chips so as to re-array the LED chips at intervals of a value equivalent to the period multiplied by a specific magnification, and a device transferring step of transferring the re-arrayed LED chips on a mounting board while keeping the re-arrayed state of the LED chips as it is.

2 Claims, 13 Drawing Sheets

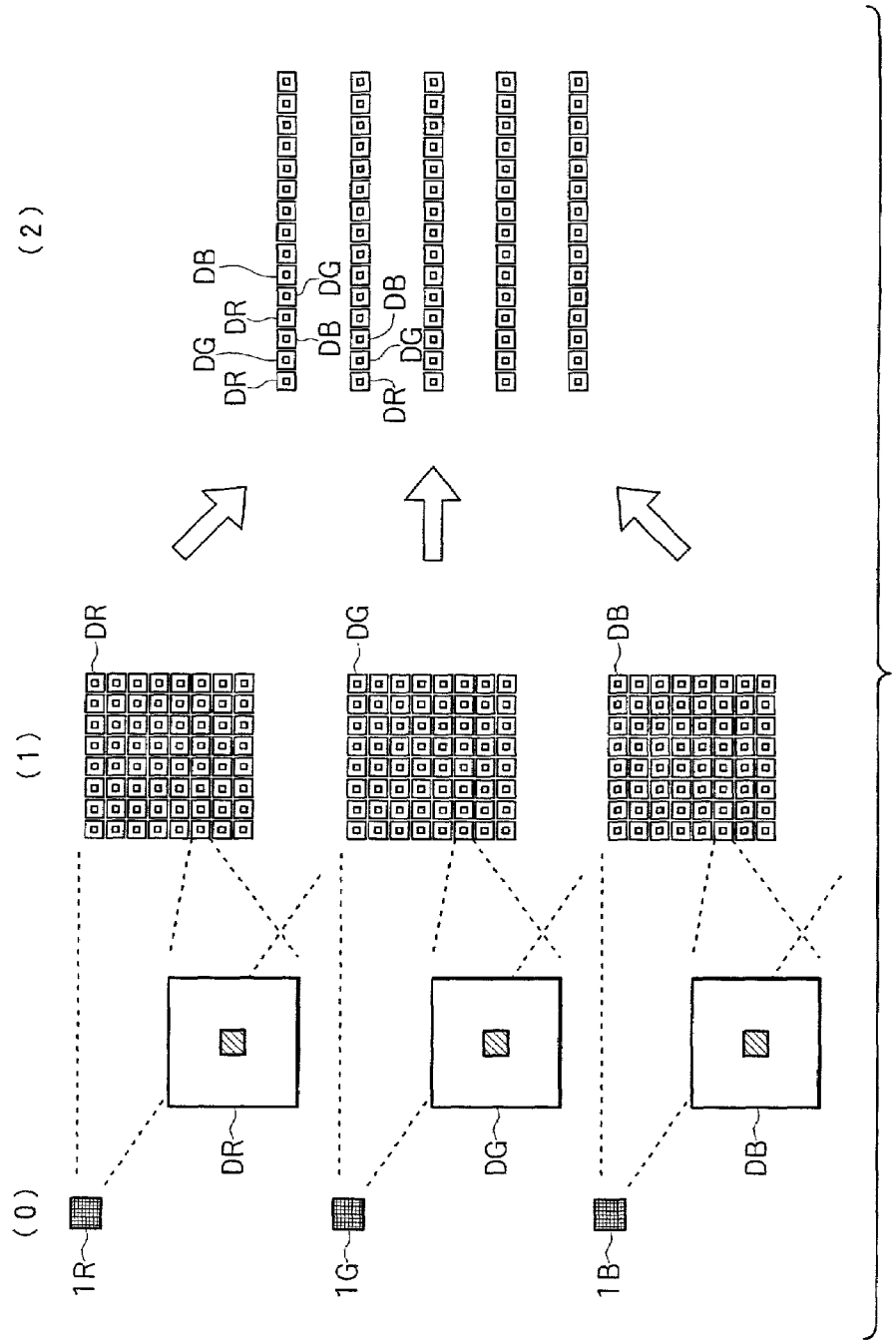

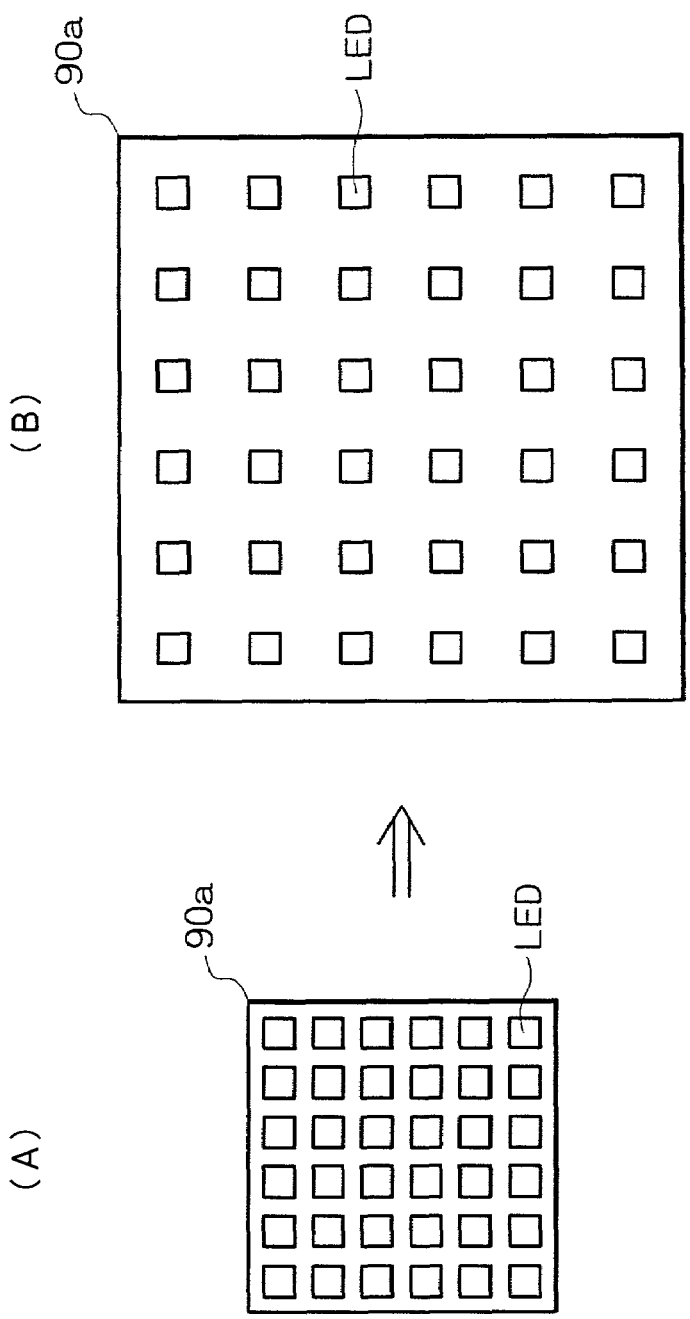

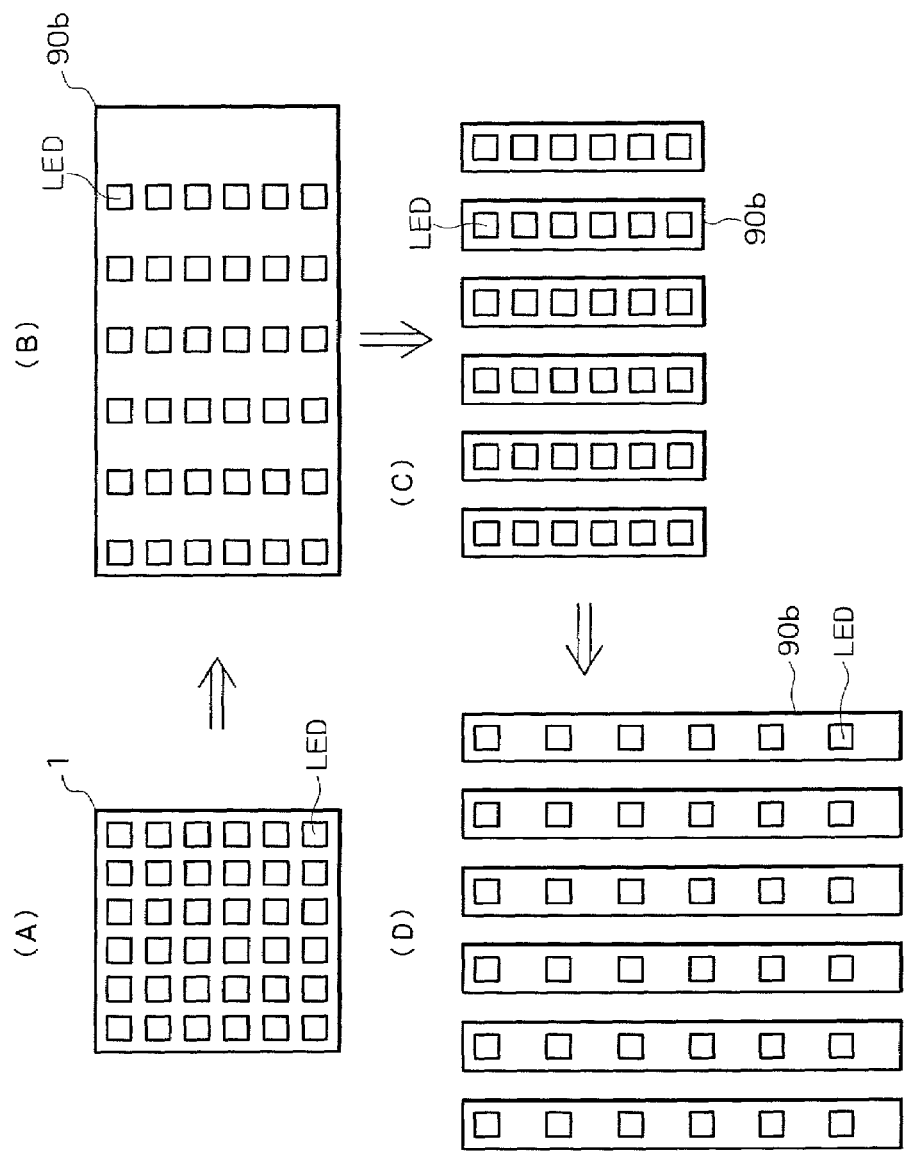

METHOD OF TRANSFERRING AND MOUNTING ELEMENTS

RELATED APPLICATION DATA

The present application claims priority to Japanese Application(s) No(s). P2000-307615 filed Oct. 6, 2000, which application(s) is/are incorporated herein by reference to the extent permitted by law.

BACKGROUND OF THE INVENTION

The present invention relates to a device mounting method, and particularly to a technique of mounting micro-semiconductor devices, which have been cut from a wafer, in a matrix array on a circuit board. More specifically, the present invention concerns a technique of producing an image display by two-dimensionally arraying light emitting diodes on a circuit board.

FIG. 11A is a schematic perspective view showing one example of an image display used for a flat type TV set. As shown in this figure, wiring portions 108 and extraction electrodes 108a for external connection are formed on the surface of a circuit board (mounting board) 7 typically made from alumina. Some of the wiring portions 108 are taken as pad electrodes, and light emitting diodes (LED chips) are fixed on the pad electrodes by die-bonding.

FIG. 11B is a schematic partial sectional view of the image display shown in FIG. 11A. As shown in this figure, the surface of the circuit board, excluding the wiring portions 108 and the extraction electrodes 108a, is covered with a black resin 123. The LED chip has a P/N junction layer. A pad electrode 122 is formed on the top of each of the LED chips. The pad electrodes 122 of the LED chips are electrically connected to the extraction electrodes 108a by wire bonding using fine wires 120. When a current is supplied to each of the LED chips with the pad electrode 122 taken as the positive side and the wiring portion 108 taken as the negative side, the P/N junction layer of the LED chip emits light, resulting in a desired display.

In general, semiconductor devices such as LED chips are formed on wafers by using a semiconductor fabrication process. In this case, the number of chips to be formed on each wafer becomes larger as the size of the chips becomes finer. The sizes of LED chips have been reduced to a level of, for example, 20 $\mu$m×20 $\mu$m. On the other hand, in some applications of image displays, the tendency toward higher definitions and larger sizes of the image displays has been increased. Typically, there has been already realized a plasma display of a type in which pixels of the number of about four millions are formed on a display board having a diagonal dimension of 50 inches. Such production of a plasma display, however, has a problem that the work of accurately arraying a large number of, for example, several millions of individual micro-devices, such as LEDs, of a size of about 20 $\mu$m×20 $\mu$m on a mounting board having a diagonal dimension of 50 inches, takes a lot of labor and also a lot of working time on the basis of the existing mounting technique. To cope with such a problem, various methods have been proposed; however, any one of the methods seems to reach the practical level. For example, U.S. Pat. Nos. 5,783,856 and 5,824,186 have disclosed a technique of providing a large number of recesses in a mounting board at positions where chips are to be arrayed, wherein micro-chips are automatically fitted in the recesses by making use of a fluidic motion; however, such a method is not necessarily effective for a device which cannot neglect not only positions but also orientations of the chips to be mounted. Japanese Patent Laid-open No. Sho 56-17385 has proposed a technique of repeating transfer of chips so as to move the chips from a wafer side to a mounting board side; however, this document does not disclose any concrete means for efficiently arraying micro-chips on a large-sized mounting board.

SUMMARY OF THE INVENTION

An object of the present invention is to provide a device mounting method capable of efficiently, accurately arraying micro-devices on a circuit board.

To achieve the above object, according to an aspect of the present invention, there is provided a device mounting method including a device separating step of separating a plurality of devices, which have been arrayed with a specific period on a wafer, into individual devices while keeping the arrayed state of the devices as it is, a device re-arraying step of handling the individually separated devices so as to re-array the devices at intervals of a value equivalent to the period multiplied by a specific magnification and a device transferring step of transferring the re-arrayed devices on a mounting board while keeping the re-arrayed state of the devices as it is.

In the above method, preferably, the device re-arraying step includes a discrete selection procedure of discretely selecting the devices at intervals of a value equivalent to the period multiplied by an integer magnification, the device transferring step includes a partial transfer procedure of transferring the selected devices on a portion of the mounting board and the plurality of devices are transferred on the entire surface of the mounting board by repeating the discrete selection procedure and the partial transfer procedure.

In particular, the discrete selection procedure may be carried out by peeling only devices, which are selected from the plurality of devices having been separated from each other on the surface of the wafer with the arrayed state thereof kept as it is, from the wafer by irradiating the selected devices with an energy beam emitted from the back surface of the wafer, and temporarily transferring the peeled devices on a temporary board, thereby re-arraying the peeled devices thereon and the partial transfer procedure may be carried out by finally transferring the devices temporarily transferred on the temporary board on the mounting board.

Alternatively, the device re-arraying step may include a fixation procedure of fixing the individually separated devices on a support enlargeable at a specific magnification while keeping the arrayed state of the devices as it is and an enlargement procedure of enlarging the support at the specific magnification, thereby re-arraying the devices with intervals of a value equivalent to the period multiplied by the specific magnification.

In particular, the fixation procedure may be carried out by fixing the individually separated devices on a film-like support deformable at the specific magnification and the enlargement procedure may be carried out by drawing the film-like support at the specific magnification.

Alternatively, the fixation procedure may be carried out by fixing the individually separated devices on a support previously, repeatedly folded so as to be developable at the specific magnification and the enlargement procedure may be carried out by developing the support at the specific magnification.

In the above method, preferably, the device separation step is carried out by separating a plurality of devices in such a manner that the devices are two-dimensionally arrayed with a specific period in the longitudinal and lateral directions and the device re-arraying step is carried out by one-dimensionally re-arraying the devices in one of the longitudinal and lateral direction, and then one-dimensionally re-arraying the devices in the other of the longitudinal and lateral directions.

The device re-arraying step is also preferably carried out by performing a first re-array operation at a first magnification and then performing a second re-array operation at a second magnification, the product of the first magnification and the second magnification being equal to the specific magnification.

In particular, the device separating step may be carried out by integratedly forming light emitting devices on a semiconductor wafer and separating the integrated light emitting devices into individual light emitting devices and the device transferring step may be carried out by transferring the light emitting devices at specific intervals on a mounting board of an image display.

With the above-described configurations of the present invention, since devices arrayed with a specific period on a wafer are individually separated from each other with the arrayed state kept as it is, the separated devices are collectively re-arrayed at intervals of a value equivalent to the period multiplied by a specific magnification and the re-arrayed devices are transferred on a mounting board with the re-arrayed state kept as it is, it is possible to efficiently, accurately mount the devices on the mounting board.

BRIEF DESCRIPTION OF THE DRAWINGS

FIG. 7 is a schematic view showing another embodiment of the device mounting method of the present invention;

FIG. 9 is a view showing still a further embodiment of the present invention;

FIG. 10 is a view showing an additional embodiment of the present invention.

DETAILED DESCRIPTION OF THE PREFERRED EMBODIMENTS

Hereinafter, embodiments of the present invention will be described in detail with reference to the drawings.

Figure 1A:
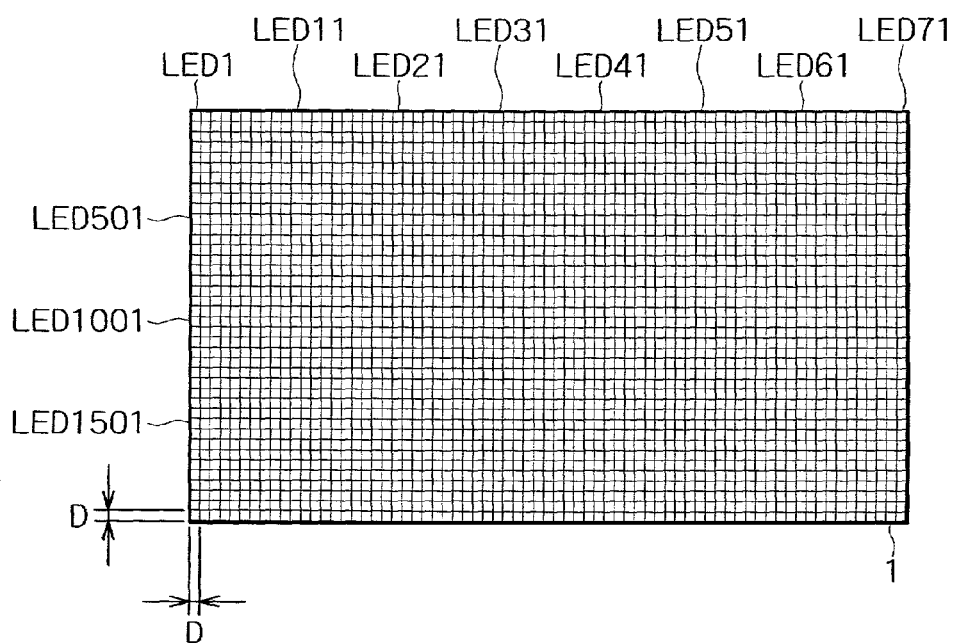
FIGS. 1A and 1B are schematic views showing an embodiment of a device mounting method of the present invention.
Figure 1B:
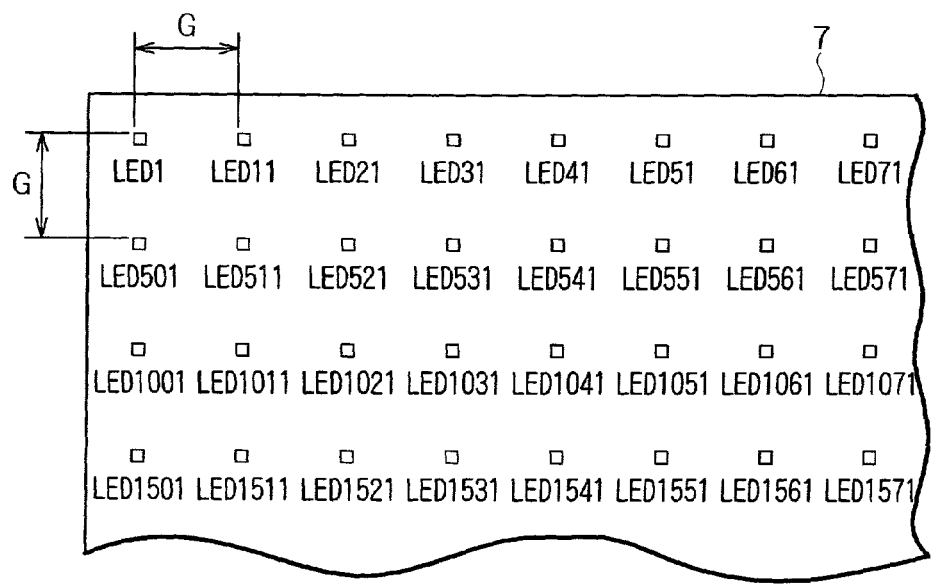

FIGS. 1A and 1B are schematic views illustrating a basic conception of a device mounting method of the present invention, wherein FIG. 1A shows an array of devices in a state before the devices are mounted on a mounting board, and FIG. 1B shows an array of the devices in a state after the devices are mounted on the mounting board.

The device mounting method of the present invention basically includes a device separating step, a device re-arraying step, and a device transferring step.

In the device separating step, a plurality of devices are integratedly formed on a wafer 1 in such a manner as to be arrayed with a specific period D, and the integrated devices are separated into individual devices with the arrayed state thereof kept as it is. In this embodiment, the devices are two-dimensionally formed on the wafer 1.

In the device re-arraying step, the individually separated devices are handled to be re-arrayed at intervals G of a value equivalent to the period D multiplied by a specific magnification.

In the device transferring step, the re-arrayed devices are transferred on a mounting board 7 with the re-arrayed state thereof kept as it is.

According to this embodiment, an image display is produced by arraying LED (Light Emitting Diode) chips in a matrix on a mounting board 7 on which circuit wiring has been formed. Specifically, in the device separating step, the LED chips are integratedly formed on a semiconductor wafer 1 and the integrated devices are separated into individual devices, and in the device transferring step, the LEDs are transferred at the specific intervals G on the mounting board 7 of the image display.

The present invention, however, is not limited to the above method of mounting LED chips but may be applied to methods of mounting other kinds of devices than LED chips. For example, driver chips for driving LEDs, which have been produced in accordance with a semiconductor fabrication process similar to that for producing LEDs, can be mounted on a circuit board at positions adjacent to those of LED chips. Also, a plurality of driver devices (for example, thin film transistors and switching transistors) formed on a substrate (for example, silicon substrate) can be re-arrayed at positions corresponding to pixel positions of a liquid crystal cell. In this case, a large-sized liquid crystal display can be produced irrespective of a size of a substrate for fabricating a plurality of driver devices, and further, color filters can be re-arrayed at positions corresponding to pixel positions (that is, specific members can be located at specific positions such as pixel positions). Further, a flat antenna can be produced by mounting antenna devices provided with micro-coils, amplifiers, and filters on a board in such a manner that they are re-arrayed at scaled-up intervals; and optical equipment for communication can be produced by mounting laser diode devices on a board in such a manner that they are re-arrayed at scaled-up intervals.

In this way, the basic conception of the present invention is to re-array micro-devices, which have been arrayed with a micro-period on a wafer, at scaled-up intervals on a large-sized board.

In the embodiment shown in FIGS. 1A and 1B, the device re-arraying step includes a discrete selection procedure of discretely selecting the LED chips at the intervals G of a value equivalent to the period D multiplied by an integer magnification and re-arraying the selected LED chips; and the device transferring step includes a partial transfer procedure of transferring the selected LED devices on a portion of the mounting board 7, wherein a large number of the LED chips are transferred on the entire surface of the mounting board 7 by repeating the discrete selection procedure and the partial transfer procedure.

In this embodiment, each interval G is set to a value of 10 D. In this case, the length dimension of the mounting board 7 becomes 10 times the length dimension of the wafer 1, and accordingly, the area of the mounting board 7 becomes 100 times the area of the wafer 1.

As shown in the figures, only the LED chips LED 1, LED 11, . . . , initially selected from the wafer 1, are transferred on a portion of the mounting board 7. Such discrete selection and partial transfer of the LED chips are repeated by 10 times in the row direction (lateral direction) and repeated by 10 times in the column direction (longitudinal direction), that is, repeated by 100 times in total in both the row direction and the column direction, with a result that all the LED chips can be transferred from the wafer 1 to the mounting board 7 in such a manner as to be re-arrayed at scaled-up intervals.

According to the mounting method of the present invention, since a large number of small-sized LED chips can be collectively re-arrayed on a mounting board, a high-precision image display can be produced at a relatively low cost.

The step of repeating the discrete selection procedure and the partial transfer procedure is hereinafter sometimes referred to as "selection and transfer step".

In each selection and transfer step, since some LED chips are discretely selected from the plurality of the LED chips closely arrayed over the wafer 1, variations in operational characteristics of the selected LED chips are correspondingly equalized. As a result, by re-arraying the LED chips, whose operational characteristics are equalized, on the mounting board 7, it is possible to equalize the operational characteristics of all the LED chips mounted on the mounting board 7. This makes it possible to eliminate a local difference in power consumption among the LEDs and hence to reduce variations in temperature over the mounting board 7. Also, since the selected LED chips can be transferred on the mounting board 7 with the positional accuracy of the LED chips on the wafer 1 kept as it is, it is possible to realize a high mounting accuracy of the LED chips on the mounting board 7. That is to say, it is not required to perform the positional adjustment of each LED chip on the mounting board 7 but it is only required to roughly perform the positional adjustment of the LED chips selected in each selection and transfer step on the mounting board 7.

Figure 2:
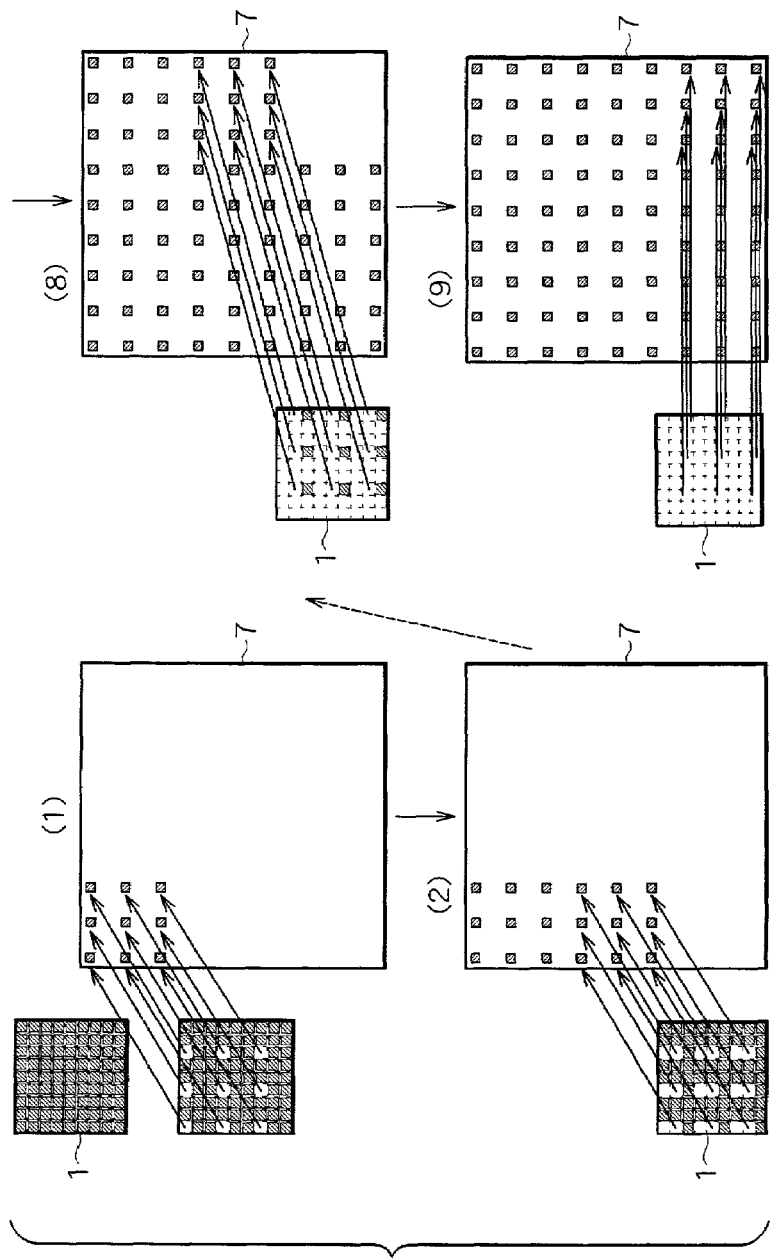
FIG. 2 is a view illustrating details of the embodiment shown in FIGS. 1A and 1B.

FIG. 2 is a schematic view of an exemplary embodiment of the selection and transfer step. For an easy understanding, in this embodiment, devices on a wafer 1 are re-arrayed at scaled-up intervals on a mounting board 7 by repeating the selection and transfer step by nine times.

Prior to a state (1) of FIG. 2, a plurality of devices, which are integratedly formed on the wafer 1 and are separated into individual devices, are prepared. A collection of the devices separated from each other with a period of the original array kept as it is, is hereinafter sometimes referred to "microchip array". In this embodiment, the microchip array has (9×9=) 81 pieces of the devices, and is divided into nine blocks. As shown in the state (1), the first selection and transfer step is carried out by selecting the devices located at the upper left corners in the nine blocks and transferring them to the mounting board 7. Subsequently, as shown in a state (2), the second selection and transfer step is carried out by selecting the devices each of which is adjacent to that selected in the first selection and transfer step in each block and transferring them to the mounting board 7. After such selection and transfer of the devices are repeated by eighth times, that is, after the selection and transfer steps shown in the states (1) to (8) are ended, only one device remains in each block. Finally, as shown in a state (9), the ninth selection and transfer step is carried out by selecting the devices remaining at the lower right corners in the nine blocks and transferring them to the mounting board 7. All of the devices on the wafer 1 are thus re-arrayed on the mounting board 7 at scaled-up intervals.

Figure 3:
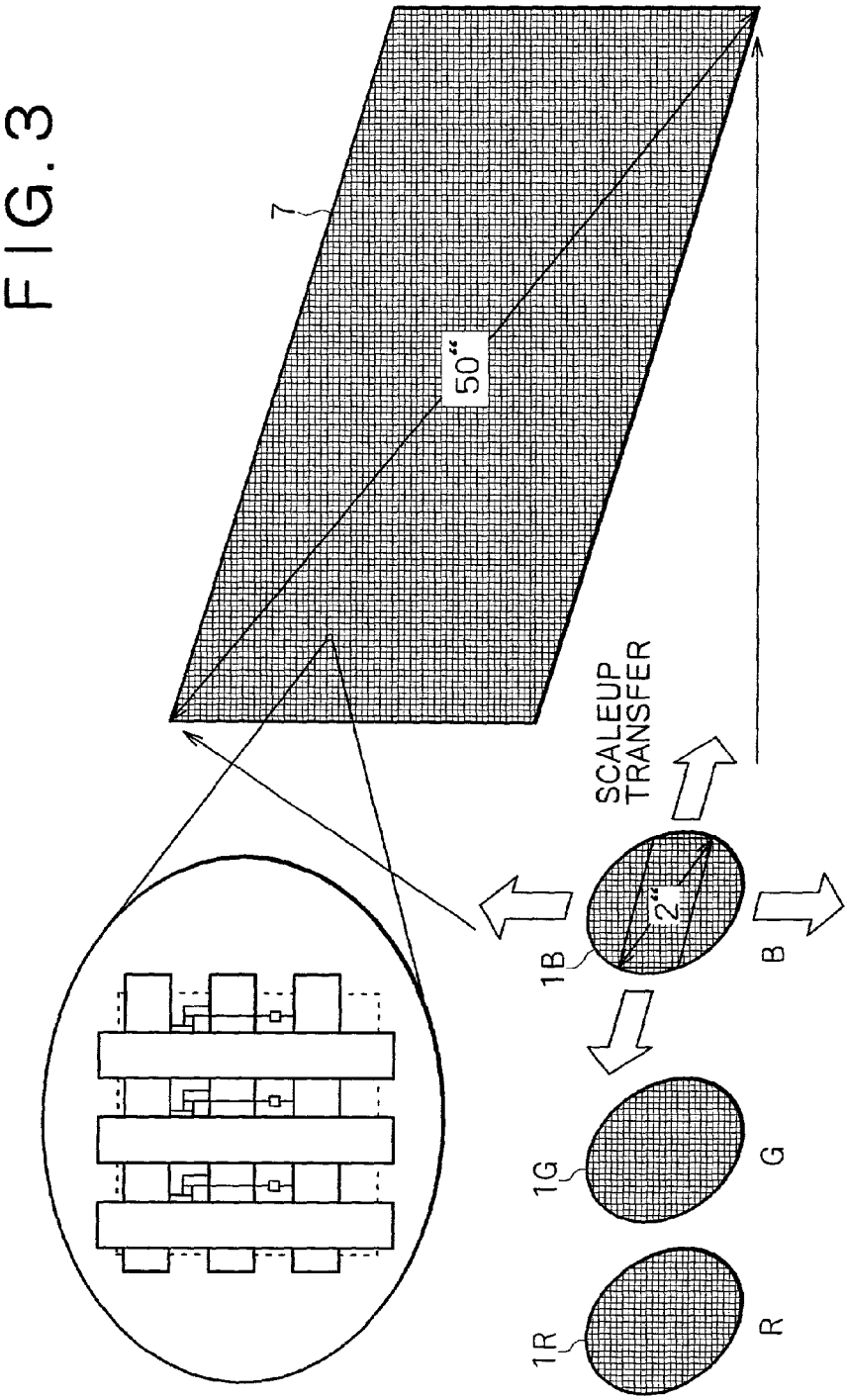
FIG. 3 is a schematic view showing an image display produced in accordance with the embodiment shown in FIGS. 1A and 1B and FIG. 2.

FIG. 3 is a schematic view showing one exemplary embodiment of an image display produced in accordance with the method of the present invention. The image display in this embodiment is a color image display in which LED chips of three primary colors, that is, red (R), green (G), and blue (B) are mounted on a circuit board having a diagonal dimension of 50 inches.

Red LED chips are integratedly formed on a wafer 1R; green LED chips are integratedly formed on a wafer 1G; and blue LED chips are integratedly formed on a wafer 1B. The size of each of the chips is, for example, 20 $\mu$m×20 $\mu$m. By applying the selection and transfer step to each of the three wafers 1R, 1G, and 1B, the chips of the number being as very large as about four millions can be accurately, efficiently mounted on the board having the diagonal dimension of 50 inches. In addition, the area, occupied by the chips to be transferred, of each wafer has a size having a diagonal dimension of 2 inches.

An enlarged view of one pixel region of the mounting board 7 is shown on the left side of FIG. 3. As shown in this enlarged view, an LED chip, an associated driver chip, and the like are precisely arranged at each intersection between wiring lines extending in the lateral and longitudinal directions.

Figure 4:
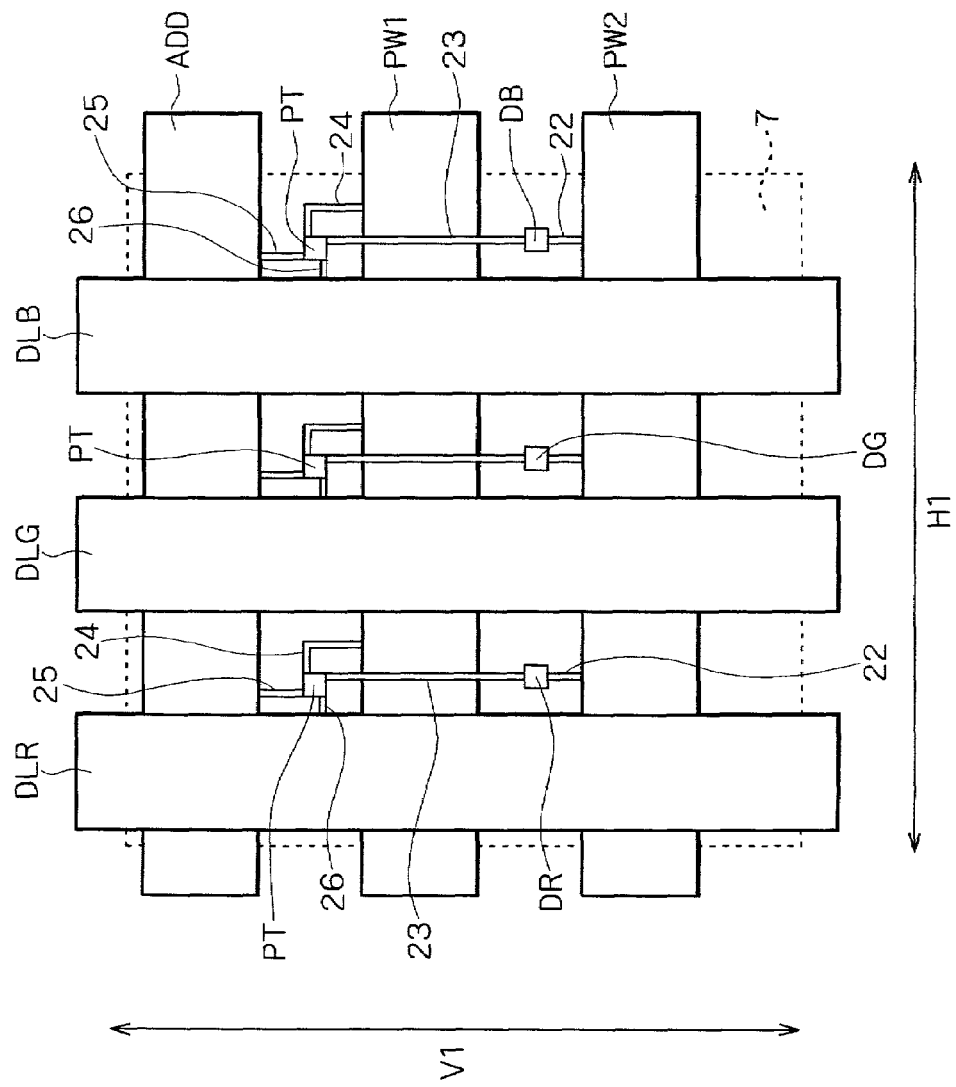
FIG. 4 is a schematic view of one pixel region of the image display shown in FIG. 3.

FIG. 4 is a schematic enlarged view showing one pixel region of the image display shown in FIG. 3. In the figure, the one pixel region is expressed by V1×H1. As shown in this figure, an address line ADD and two power source lines PW1 and PW2, which extend in the lateral direction, are spaced from each other at specific intervals. The width of each of the lines ADD, PW1 and PW2 is wider than each chip size of LEDs and current retaining circuits (drivers). In the same pixel region, signal lines DLR, DLG and DLB for respective LEDs, which extend in the longitudinal direction, are spaced from each other at specific intervals. The dimension of each of the single lines DLR, DLG, and DLB is the same as the dimension of the address line ADD.

In the image display according to this embodiment, the LEDs DR, DG and DB are arrayed in a matrix, and are adapted to emit light in response to specific image signals. The red LED DR, the green LED DG, and the blue LED DB are arrayed in this order in the pixel region, and form one pixel set. Each of the LEDs DR, DG and DB has a chip structure mounted on the board, which structure has an approximately square shape and a micro-size. The LEDs DR, DG and DB are mounted in a region between the power source lines PW1 and PW2.

In this image display, current retaining circuits (drivers) PT, which are electrically connected to the LEDs DR, DG and DB for retaining currents flowing the LEDs DR, DG and DB, are formed for respective LEDs DR, DG and DB. The current retaining circuit PT has a circuit configuration including transistors and a capacitance, and is particularly formed into a micro-chip shape mounted on the mounting board 7. In this embodiment, the chip size of each of the LEDs DR, DG and DB is nearly equal to the chip size of a driver chip forming the current retaining circuit PT. This is advantageous in that the LEDs and the current retaining circuits PT can be mounted in the same mounting step, thereby facilitating the production steps. These current retaining circuits PT are mounted in a region between the power source line PW1 and the address line ADD.

For wiring the LEDs and the current retaining circuits PT, wiring portions 22 to 26 are formed between each of the LEDs DR, DG and DB and the corresponding current retaining circuit PT, and between the current retaining circuit PT and each of the signal lines DLR, DLG and DLB, the address line ADD, and the power source lines PW1 and PW2.

The three wiring portions 22, each of which is a strip-like small region, extend in the longitudinal direction for connecting the LEDs DR, DG and DB to the power source line PW2. The three wiring portions 23, each of which is a strip-like region, extend in the longitudinal direction for connecting the LEDs DR, DG and DB to the three current retaining circuits PT for retaining currents for driving the LEDs. The three wiring portions 24, each of which is a strip-like region, extend in the lateral direction from the three current retaining circuits PT and then extending in the longitudinal direction so as to be connected to the power source line PW1, thereby connecting the three current retaining circuits PT to the power source line PW1. The three wiring portions 25, each of which is a strip-like small region, extend in the longitudinal direction for connecting the three current retaining circuits PT to the address line ADD. The three wiring portions 26, each of which is a strip-like small region, extend in the lateral direction for connecting the three current retaining circuits PT to the signal lines DLR, DLG and DLB. In the case of mounting the micro-chips of the LEDs DR, DG and DB on the mounting board 7, each of the wiring portions 22 to 26 can be made from a conductive material for connection, and similarly, in the case of mounting microchips of the current retaining circuits PT on the mounting board 7, each of the wiring portions 22 to 26 can be made from a conductive material for connection.

Figure 5:
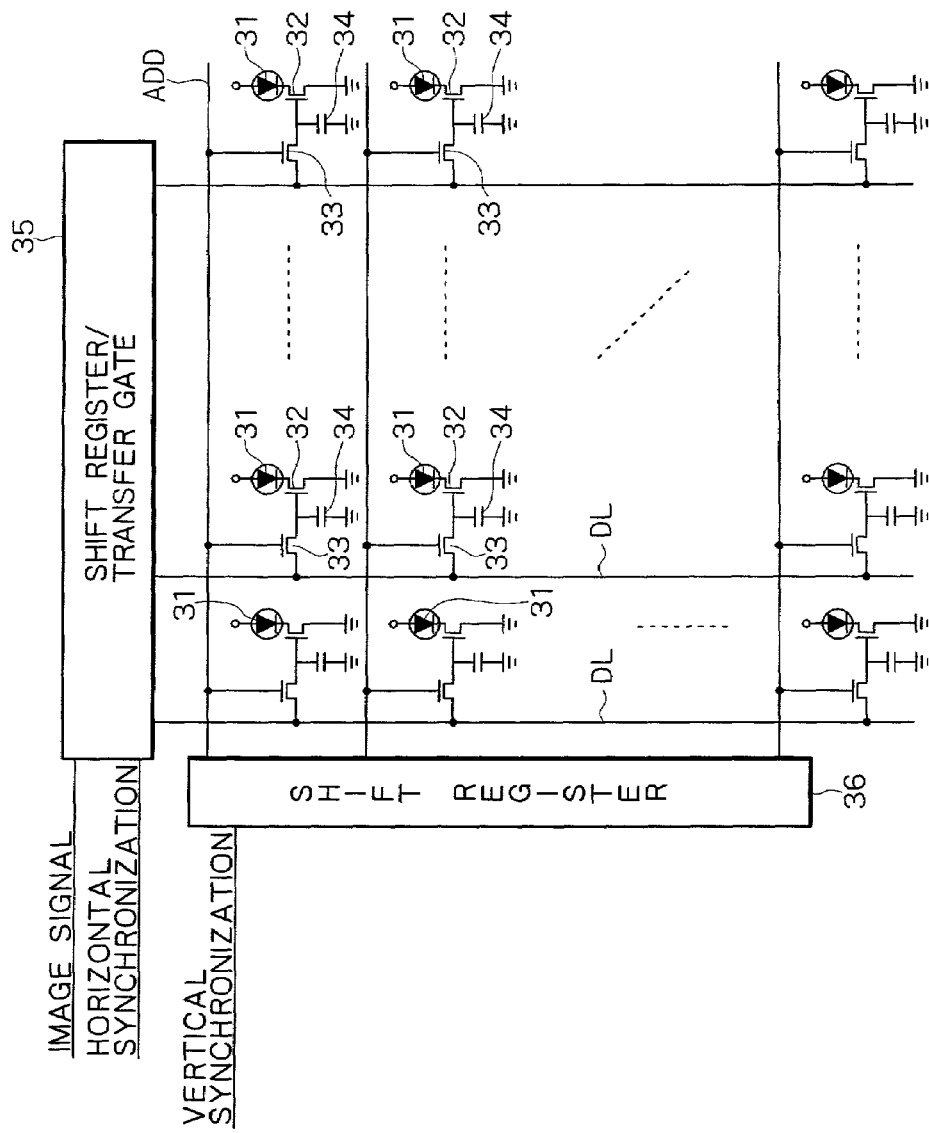
FIG. 5 is an equivalent circuit diagram of the image display shown in FIG. 3.

FIG. 5 is a circuit diagram of the image display shown in FIGS. 3 and 4. In the figure, the LED chip is represented by a diode 31 for performing light emission of a specific color in response to an image signal. It is to be noted that although in practice, three diodes 31 of red, green, and blue arrayed in the horizontal (lateral) direction form one pixel, only one diode 31 is shown for simplicity of description.

Transistors 32 and 33 and a capacitance 34, which are connected to the diode 31, form a current retaining circuit. The transistor 32 is connected in series between the power source lines PW1 and PW2. Only when the transistor 32 is turned on, the diode 31 emits light. One of the power source lines PW1 and PW2 supplies a ground voltage and the other supplies a source voltage. One terminal of the capacitance 34 and one of source and drain regions of the transistor 33 functioning as a switching transistor are connected to a gate of the transistor 32. The other of the source and drain regions of the transistor 33 is connected to the signal line DL to which image signals are supplied. A gate of the transistor 33 is connected to the address line ADD extending in the lateral direction.

Each address line ADD has a structure in which the level is selectively switched by a shift register circuit 36. For example, only one of a plurality of the horizontal address lines is shifted to a high level, to be thus selected. Each signal line DL is adapted to transmit image signals to each LED 31. One signal line DL is provided for the LEDs 31 arrayed in one column. The levels of the address lines ADD are selectively shifted by the shift register circuit 36. On the other hand, the signal lines DL are scanned by a shift register/transfer gate circuit 35, and an image signal is supplied to the selected signal line DL via the shift register/transfer gate circuit 35.

The capacitance 34, which is connected to the gate of the transistor 32 and also connected to one of the source and drain regions of the transistor 33, has a function of retaining a potential of the gate of the transistor 32 when the transistor 33 is turned off. Since the gate voltage of the transistor 32 can be retained even if the transistor 33 is turned off, the LED 31 can be continuously driven.

The operation of the image display will be briefly described below. When a voltage is applied from the shift register circuit 36 to one of the horizontal address lines ADD so as to select the address line ADD, each switching transistor 33 in the selected address line ADD is turned on. At this time, when an image signal is applied as a voltage to one of the signal lines DL extending in the vertical (longitudinal) direction, the voltage reaches the gate of the transistor 32 via the switching transistor 33 and at the same time the gate voltage is stored in the capacitance 34. The capacitance 34 is operated to retain the gate voltage. After the selection of the address line ADD in the horizontal (lateral) direction is stopped, the potential of the address line, which has been selected, is shifted again to a low level and thereby the transistor 33 is turned off. Even in such a case, the capacitance 34 continues to retain the gate voltage. In principle, the capacitance 34 can continue the retention of the gate voltage at the time of address selection until the next address selection occurs. During the period in which the capacitance 34 retains the gate voltage, the transistor 32 performs the operation corresponding to the retained voltage, that is, continuously allows the flow of a drive current in the LED 31. Since the time required for light emission of the LED 31 can be made longer, the luminance of the entire image can be enhanced even if a drive current for driving each LED is reduced. Accordingly, the size of each chip of the LED 31 is made as fine as possible.

The method of producing the image display shown in FIGS. 3 to 5 will be described with reference to FIGS. 6A to 6I. In this embodiment, chips are mounted on a board by adopting the selection and transfer step in which the discrete selection procedure and the partial transfer procedure are repeated. In particular, according to this production method, the discrete selection procedure is carried out by peeling only chips, which are selected from a plurality of chips having been separated from each other on the surface of a wafer with the arrayed state thereof kept as it is, from the wafer by irradiating the selected chips with an energy beam (for example, laser beam) emitted from the back surface of the wafer, and temporarily transferring the peeled chips on a temporary board, thereby re-arraying the peeled chips thereon; and the partial transfer procedure is carried out by finally transferring the chips temporarily transferred on the temporary board on the mounting board. The process from a step of forming the LED chips to a step of mounting the LED chips on the mounting board will be hereinafter described.

Figure 6A:
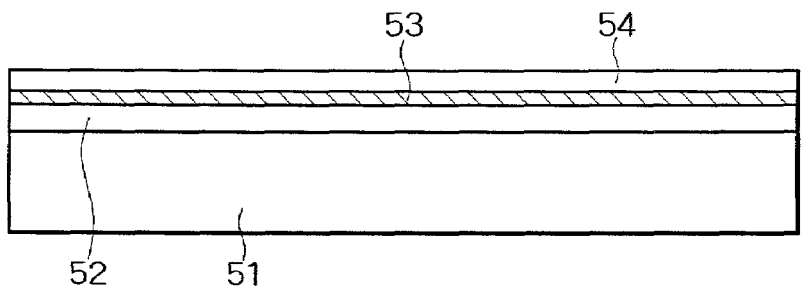
FIGS. 6A to 6I are views showing sequential steps of producing the image display shown in FIG. 3.

Referring to FIG. 6A, low temperature and high temperature buffer layers (not shown) are formed on a sapphire substrate 51, and then a second conductive type cladding layer 52, an active layer 53, and a first conductive type cladding layer 54 are sequentially stacked on the buffer layers. The sapphire substrate 51 is taken as a wafer on which devices are to be formed. In the case of producing blue and green LEDs, each of the second conductive type cladding layer 52, the active layer 53, and the first conductive type cladding layer 54 can be formed of a gallium nitride based crystal growth layer. A light emitting diode layer of a double-hetero structure having a pn-junction is formed on the sapphire substrate 51.

Figure 6B:
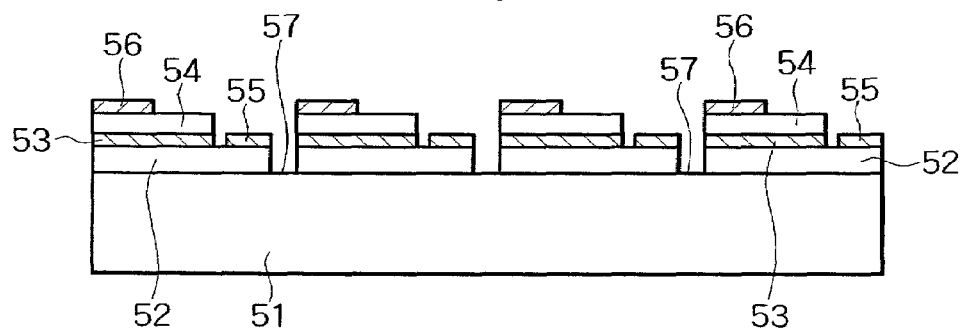

Referring to FIG. 6B, n-type electrodes 55 are formed at positions corresponding to those of respective LEDs so as to be connected to the second conductive type cladding layer 52 and p-type electrodes 56 are formed at positions corresponding to those of respective LEDs so as to be connected to the first conductive type cladding layer 54 by making use of photolithography, vapor-deposition, and reactive ion etching. Separation grooves 57 for separating respective LEDs from each other are then formed. The separation grooves 57 generally has a grid pattern for forming LEDs having square shapes; however, they may have another grid pattern. The depth of the separation grooves 57 is set to a value which allows exposure of a principal plane of the sapphire substrate 51. Accordingly, the second conductive type cladding layer 52 is separated into parts corresponding to respective LEDs by the separation grooves 57. The size of each LED having a square shape, which is expressed by an occupied area, is in a range of about 25 $\mu m^2$ to 10,000 $\mu m^2$, and the length of one side of each LED is in a range of about 5 $\mu m$ to 100 $\mu m$.

Figure 6C:
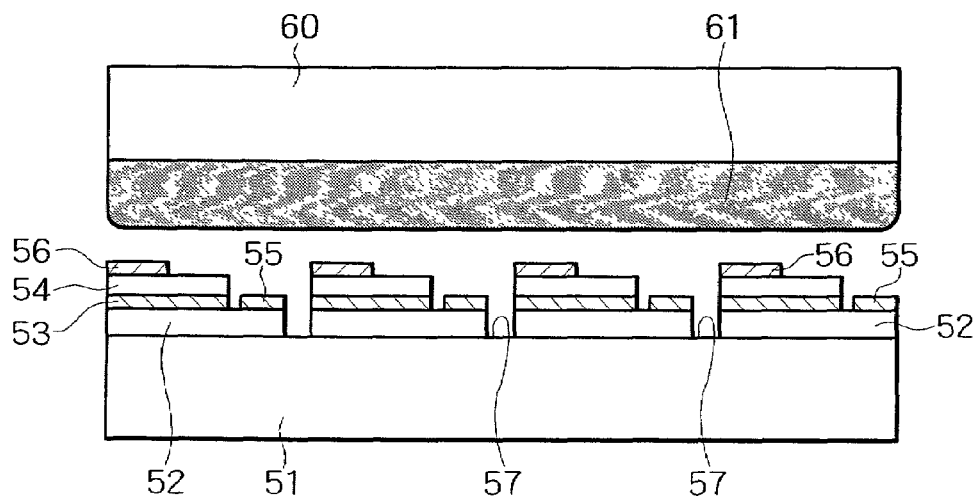

Referring to FIG. 6C, a temporarily retaining board (temporary board) 60 is prepared for retaining the LEDs at the time of transferring the LEDs. The surface of the temporarily retaining board 60 is coated with an adhesive layer 61. The surface of the adhesive layer 61 is pressed onto the LED side, on which the separation grooves 57 have been formed, of the substrate 51, whereby the surface sides of the LEDs are adhesively bonded on the surface of the adhesive layer 61.

Figure 6D:
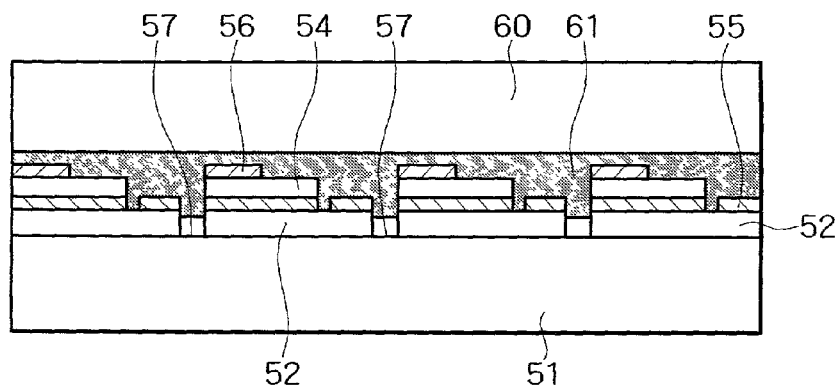

Referring to FIG. 6D, a high output pulse ultraviolet laser beam, for example, an excimer laser beam is emitted as an energy beam from the back surface side of the sapphire substrate 51. The laser beam passes through the back surface side of the sapphire substrate 51 and reaches the surface side of the sapphire substrate 51. At this time, only the LED previously selected by the discrete selection procedure (the second LED, from the left side, of the four LEDs in FIG. 6D) is irradiated with the laser beam. With the irradiation of the high output pulse ultraviolet laser beam, in the vicinity of the interface between the sapphire substrate 51 and the second conductive type cladding layer 52 which is, for example, formed of the gallium nitride layer as the crystal layer, the gallium nitride layer is decomposed into nitrogen gas and metal gallium, with a result that the bonding force between the second conductive type cladding layer 52 and the sapphire substrate 51 becomes weak.

Figure 6E:
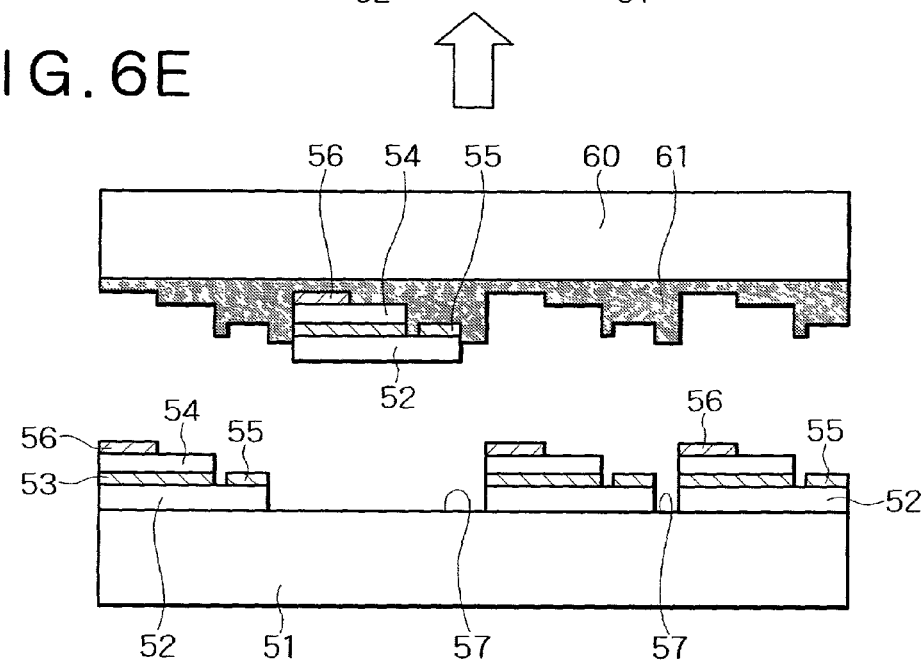

Referring to FIG. 6E, at only the selected LED, the second conductive type cladding layer 52 as the crystal layer is easily peeled from the sapphire substrate 51. As a result, only the selected LED is transferred to the temporarily retaining board 60.

Figure 6F:
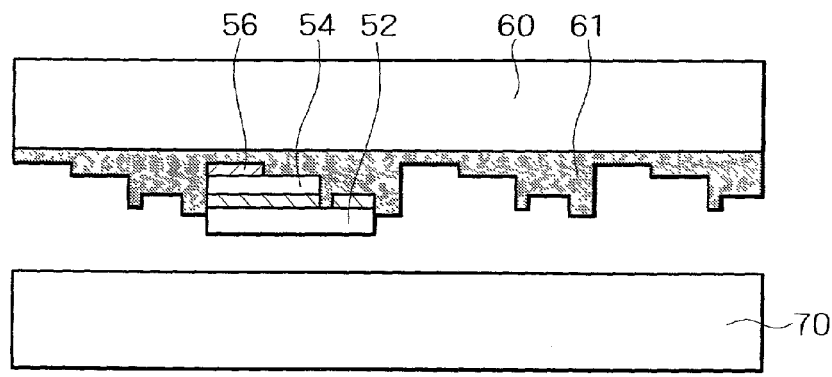

Referring to FIG. 6F, the LED thus transferred to the temporarily retaining board 60 is re-transferred to another temporary board 70. While not shown, the temporary board 70 has the same configuration as that of the temporarily retaining board 60, and accordingly, it has an adhesive layer.

Figure 6G:
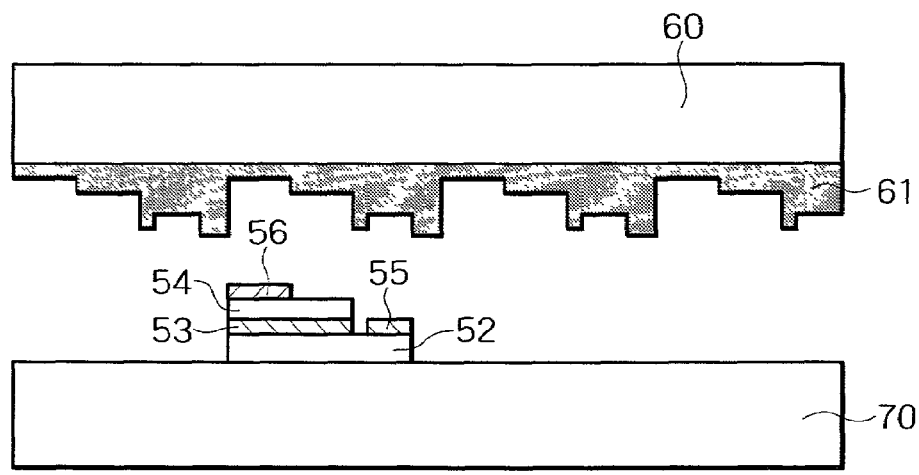

FIG. 6G shows the state after the selected LED is re-transferred from the temporarily retaining board 60 to the temporary board 70.

Figure 6H:
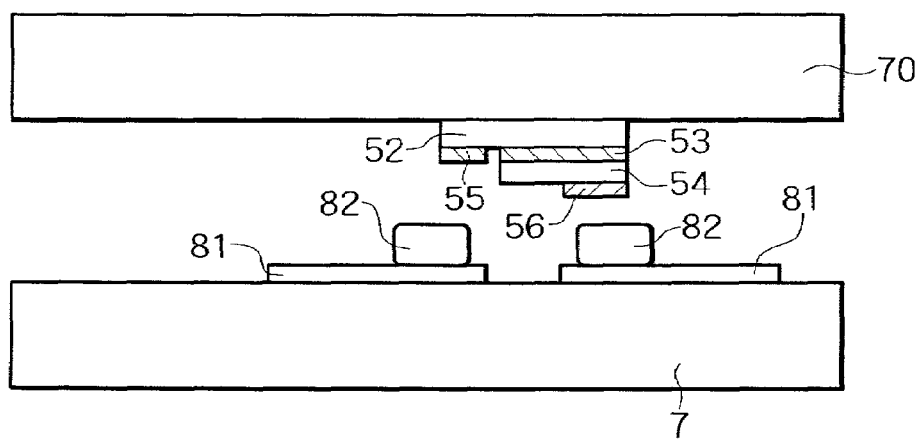

Referring to FIG. 6H, there is shown a wiring board (mounting board) 7 on which wiring electrodes 81 such as specific signal lines, address lines, power source lines, ground lines, and the like are previously formed. The wiring board 7 may be of any type generally used for fabrication of semiconductors insofar as address lines and data lines can be formed thereon with desired accuracy, for example, a glass board, a metal board covered with a synthetic resin or an insulating layer, or a silicon board. Conductive materials 82 for connection are formed on the wiring electrodes 81. The conductive material 82 for connection may be any material insofar as it can be deformed and electrically connected to the LED when being compression-bonded.

Figure 6I:
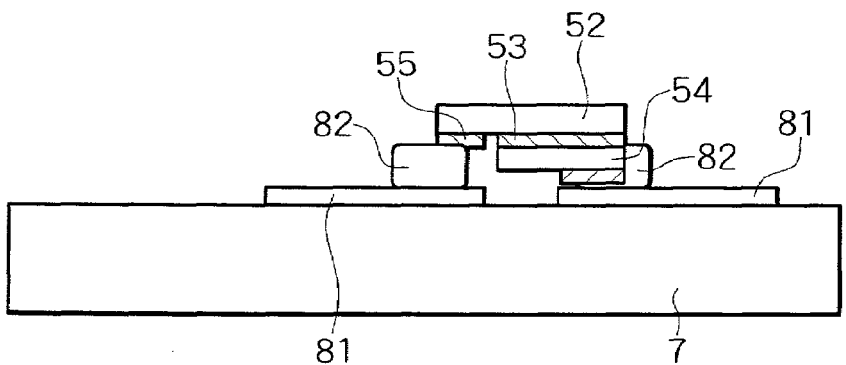

Referring to FIG. 6I, the temporary board 70 is moved closer to the wiring board 7, and the LED is compression-bonded to the conductive materials 82 located at specific positions. With the compression-bonding of the LED in a non-package state, the conductive materials 82 for connection are deformed but are certainly bonded to the LED. The mounting of the LED on the wiring board 7 is thus accomplished. The work of mounting the LED is repeated for the remaining LEDs, to obtain an image display in which pixels are arrayed in a matrix. The current retaining circuits can be similarly mounted in a non-package state, and thereby a circuit configuration having the current retaining circuits can be easily produced. In the above embodiment, LEDs formed on the sapphire substrate are transferred therefrom by using the laser peeling method. In the case of using a GaN substrate in place of the sapphire substrate, an element (for example, In) for absorbing ultraviolet rays may be added to the substrate in order to effectively carry out the laser peeling method.

FIG. 7 is a schematic view showing another embodiment of the device mounting method of the present invention. This embodiment, which relates to a method of producing a color image display by mounting LEDs of three primary colors, RGB on a circuit board, is different from the device mounting method shown in FIGS. 1A and 1B and FIG. 2 in that this embodiment adopts a two-step re-arraying method. According to this embodiment, the LED chip re-arraying step is carried out by performing a first re-arraying step at a first magnification and then performing a second re-arraying step at a second magnification, wherein the product of the first and second magnifications becomes a target magnification. In this embodiment, the LED chips can be handled by using different manners in the first and second re-arraying steps.

As shown in a state (0), micro-chip arrays 1R, 1G and 1B for three primary colors, RGB are prepared. In each micro-chip array, chips each having a size of 20 $\mu m \times 20$ $\mu m$ have been integratedly formed with a period of 25 $\mu m$ and separated into individual chips with the arrayed state kept as it is.

As shown in a state (1), the first re-arraying step is carried out by re-arraying the chips in each microchip array at intervals of a value equivalent to the period multiplied by a first magnification of 8. As a result, after the first re-arraying step, the LED chips DR, DG and DB are each two-dimensionally arrayed at intervals of 200 $\mu m$ (25 m×8). In addition, as shown in the state (1), each LED chip is buried in a square case having a size of 160 $\mu m \times 160$ $\mu m$.

As shown in a state (2), the second re-arraying step is carried out at a second magnification of 3. As a result, the original period (set to 25 $\mu m$) is multiplied by the product of the first and second magnifications (24= 8×3). Accordingly, the LED chips are finally re-arrayed at scaled-up intervals of 600 $\mu m$. In addition, since the second magnification is set to 3 at the second re-arraying step, the LED chips DR, DG and DB can be arrayed in this order as shown in the state (2). The three LEDs DR, DG and DB form one pixel.

Figure 8A:
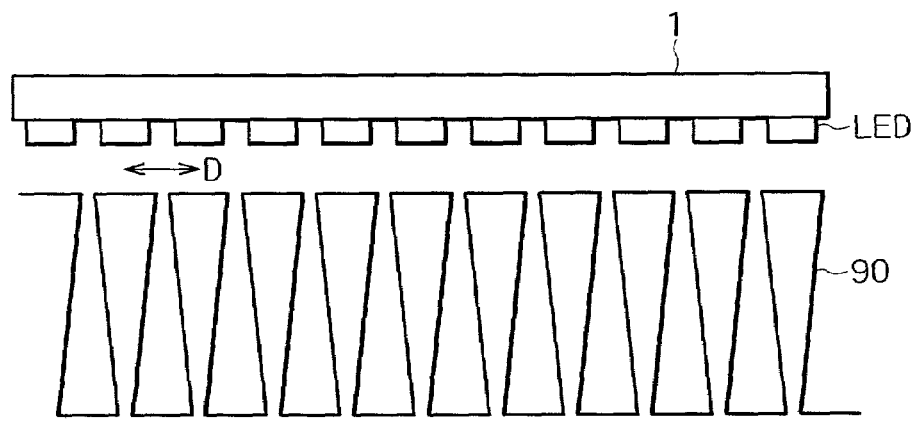
FIGS. 8A to 8C are views showing a further embodiment of the present invention.
Figure 8B:
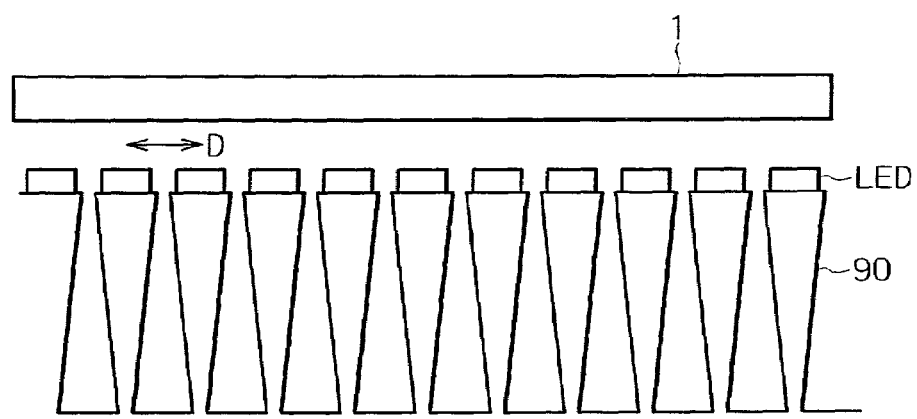
Figure 8C:
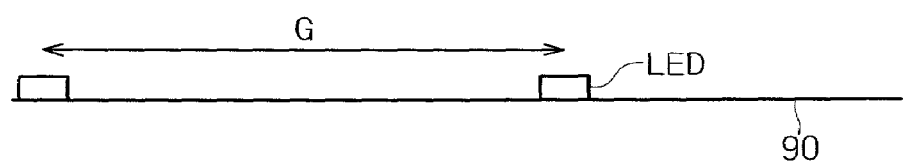
Figure 11A:
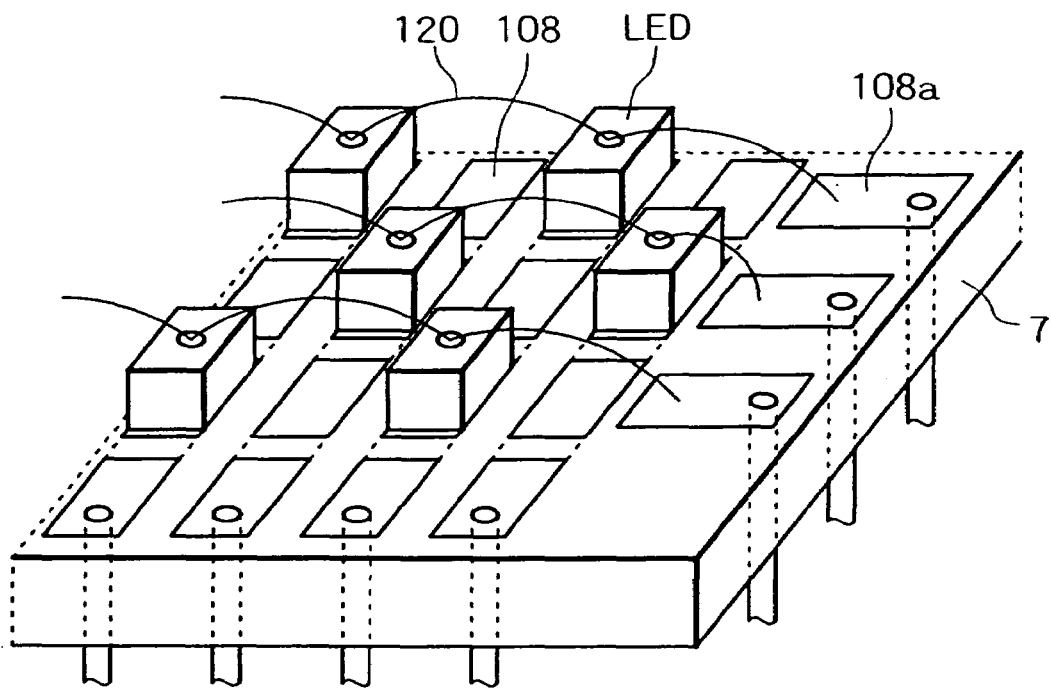
FIGS. 11A and 11B are schematic views showing one embodiment of a related art image display.
Figure 11B:
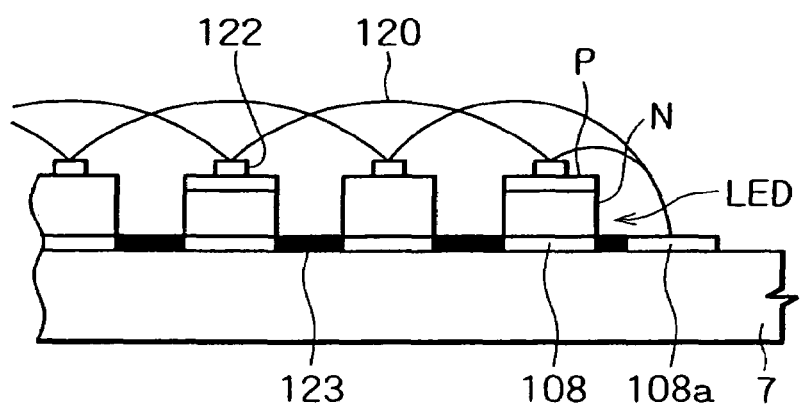

FIGS. 8A to 8C are schematic views showing a further embodiment of the device mounting method of the present invention, particularly, illustrating re-arraying steps. As shown in FIG. 8A, a wafer 1 and a support 90 enlargeable at a specific magnification are first prepared. On the wafer 1, LED chips have been integratedly formed with a specific period D and separated into individual LED chips with the arrayed state thereof kept as it is. As shown in FIG. 8B, a fixation procedure is carried out by fixing the individually separated LED chips on the support 90 with the arrayed state thereof kept at it is. As shown in FIG. 8C, an enlargement procedure is carried out by enlarging the support 90 at the specific magnification, so that the LED chips are re-arrayed at intervals G of a value equivalent to the original period D multiplied by the specific magnification. In particular, according to this embodiment, in the fixation procedure shown in FIG. 8B, the individually separated LED chips are fixedly transferred from the wafer 1 onto the support 90 which is previously, repeatedly folded so as to be developable at the specific magnification, and in the enlargement procedure shown in FIG. 8C, the support 90 is developed at the specific magnification. With these fixation procedure and enlargement procedure, the LED chips can be automatically re-arrayed at scaled-up intervals. In addition, in the case of adopting such a bellows type re-arraying method, since it is difficult to re-array LED chips, which have been two-dimensionally arrayed, at scaled-up intervals at one step, the step of one-dimensionally re-arraying the LED chips at scaled-up intervals may be repeated twice in the longitudinal and lateral directions, to finally re-array the LED chips at scaled-up intervals. To be more specific, in a device separating step, a plurality of devices are integratedly formed and separated so as to be two-dimensionally arrayed with a specific period in the longitudinal and lateral directions, and in a re-arraying step, the devices are one-dimensionally re-arrayed at scaled-up intervals in one of the longitudinal and lateral directions by the bellows type re-arraying method, and then the devices are one-dimensionally re-arrayed at scaled-up intervals in the other of the longitudinal and lateral directions by the bellows type re-arraying method. In addition, the support previously, repeatedly folded so as to be developable at a specific magnification may be made from, for example, aluminum.

FIG. 9 is a schematic view showing still a further embodiment of the device mounting method of the present invention. This embodiment is basically the same as the previous embodiment shown in FIGS. 8A to 8C except that a film-like support elastically or plastically deformable at a specific magnification is used in place of the support previously, repeatedly folded so as to be developable. As shown in a state (A) of FIG. 9, individually separated LED chips are fixed on a film-like support 90a elastically deformable at a specific magnification. The film-like support 90a may be formed of a plastic film biaxially stretchable at the same rate in the directions perpendicular to each other. As shown in a state (B) of FIG. 9, the film-like support 90a is biaxially stretched at a specific magnification in the longitudinal and lateral directions. With this method, the LED chips can be automatically re-arrayed at scaled-up intervals. The LED chips thus re-arrayed at the scaled-up intervals are transferred on a mounting board.

FIG. 10 is a schematic view showing an additional embodiment of the device mounting method of the present invention. In this embodiment, the above-described selection and transfer method is combined with the above-described stretching method. As shown in a state (A) of FIG. 10, in a device separating step, a plurality of LED chips are integratedly formed on a wafer 1 and separated so as to be two-dimensionally arrayed with a specific period in the longitudinal and lateral directions. As shown in a state (B), in a first re-arraying step, the LED chips are one-dimensionally re-arrayed, for example, in the lateral direction on a support 90b by the selection and transfer method. The support 90b is formed of a film uniaxially stretchable at a specific magnification in the longitudinal direction. As shown in a state (C), the film-like support 90b is cut into stripes with the state of the LED chips re-arrayed at scaled-up intervals in the lateral direction kept as it is. As shown in a state (D), the stripes cut from the support 90b are uniaxially stretched, whereby the LED chips are one-dimensionally re-arrayed in the longitudinal direction. As is apparent from comparison of the state (A) with the state (D), the LED chips are two-dimensionally re-arrayed at scaled-up intervals.

As described above, according to the present invention, it is possible to efficiently, accurately mount micro-chips from a wafer onto a board by carrying out the device separating step, the device enlargedly re-arraying step, and the device transfer step, and hence to lower the production cost and enhance the accuracy of a product.

While the preferred embodiments of the present invention have been described using specific terms, such description is for illustrative purposes only, and it is to be understood that changes and variations may be made without departing from the spirit or scope of the following claims.

What is claimed is:

1. A method for mounting a plurality of elements comprising:
    separating a plurality of elements, from a substrate which are arrayed at a first period on the substrate, into individual elements while keeping the first period as it is, wherein more than one but not all of the elements in a given row are separated from the substrate;
    handling the individually separated elements so as to re-array the elements at a second period having a value equivalent to a multiple of the first period; and
    transferring the re-arrayed elements on a mounting board, wherein the elements are mounted to the mounting board at a period equivalent to the second period,
    wherein said element re-arraying step comprises fixing the individually separated elements on a support enlargeable by a set multiple while keeping the first period of the elements as it is, and enlarging the support by the set multiple, thereby re-arraying the elements at a second period having a value equivalent to the first period multiplied by the set multiple, and wherein said fixing is carried out by fixing the individually separated elements on film support deformable by said set multiple, and said enlarging is carried out by drawing the support at said set multiple.

2. A method for mounting a plurality of elements comprising:
    separating a plurality of elements, from a substrate which are arrayed at a first period on the substrate, into individual elements while keeping the first period as it is, wherein more than one but not all of the elements in a given row are separated from the substrate;
    handling the individually separated elements so as to re-array the elements at a second period having a value equivalent to a multiple of the first period; and
    transferring the re-arrayed elements on a mounting board, wherein the elements are mounted to the mounting board at a period equivalent to the second period,
    wherein said element re-arraying step comprises fixing the individually separated elements on a support enlargeable by a set multiple while keeping the first period of the elements as it is, and enlarging the support by the set multiple, thereby re-arraying the elements at a second period having a value equivalent to the first period multiplied by the set multiple, and wherein said fixing is carried out by fixing the individually separated elements on a support previously, repeatedly folded so as to be developable at said set multiple, and said enlarging is carried out by developing the support at said set multiple.

\* \* \* \* \*